United States Patent
Efimov et al.

(10) Patent No.: US 8,271,850 B2
(45) Date of Patent: Sep. 18, 2012

(54) FAST LOW-DENSITY PARITY-CHECK CODE ENCODER

(75) Inventors: Andrey Gennadievich Efimov, St. Petersburg (RU); Andrey Vladimirovich Belogolovy, Saint Petersburg (RU)

(73) Assignee: Intel Corporation, Santa Clara, CA (US)

(*) Notice: Subject to any disclaimer, the term of this patent is extended or adjusted under 35 U.S.C. 154(b) by 721 days.

(21) Appl. No.: 12/087,177

(22) PCT Filed: Dec. 29, 2005

(86) PCT No.: PCT/RU2005/000682
§ 371 (c)(1),
(2), (4) Date: Jul. 28, 2009

(87) PCT Pub. No.: WO2007/075106
PCT Pub. Date: Jul. 5, 2007

(65) Prior Publication Data
US 2010/0070825 A1    Mar. 18, 2010

(51) Int. Cl.
*G06F 11/00*  (2006.01)
(52) U.S. Cl. .......... 714/758; 714/752; 714/804
(58) Field of Classification Search .......... None
See application file for complete search history.

(56) References Cited

U.S. PATENT DOCUMENTS

| | | | | |
|---|---|---|---|---|
| 7,334,181 B2* | 2/2008 | Eroz et al. | | 714/801 |
| 7,590,914 B2* | 9/2009 | Kim et al. | | 714/752 |
| 7,617,433 B2* | 11/2009 | Lee et al. | | 714/752 |
| 7,747,929 B2* | 6/2010 | Kyung et al. | | 714/779 |
| 7,814,393 B2* | 10/2010 | Kyung et al. | | 714/758 |
| 7,844,877 B2* | 11/2010 | Litsyn et al. | | 714/752 |
| 2004/0054960 A1* | 3/2004 | Eroz et al. | | 714/800 |
| 2004/0086059 A1 | 5/2004 | Eroz et al. | | |
| 2005/0246617 A1* | 11/2005 | Kyung et al. | | 714/801 |
| 2005/0283707 A1* | 12/2005 | Sharon et al. | | 714/758 |
| 2006/0005105 A1* | 1/2006 | Yoshida | | 714/758 |
| 2006/0036925 A1* | 2/2006 | Kyung et al. | | 714/758 |
| 2006/0036926 A1* | 2/2006 | Hocevar | | 714/758 |
| 2006/0045197 A1* | 3/2006 | Ungerboeck et al. | | 375/261 |
| 2006/0156206 A1* | 7/2006 | Shen et al. | | 714/784 |
| 2007/0081475 A1* | 4/2007 | Telado et al. | | 370/255 |
| 2007/0101246 A1* | 5/2007 | Kyung et al. | | 714/804 |
| 2007/0162822 A1* | 7/2007 | Choi et al. | | 714/758 |
| 2008/0052596 A1* | 2/2008 | Heinrich et al. | | 714/758 |
| 2009/0259783 A1* | 10/2009 | Solomon et al. | | 710/105 |
| 2010/0122140 A1* | 5/2010 | Shen et al. | | 714/752 |
| 2011/0093760 A1* | 4/2011 | Gong et al. | | 714/758 |
| 2011/0167315 A1* | 7/2011 | Kyung et al. | | 714/752 |

OTHER PUBLICATIONS

Mayhew, D., et al., "PCI Express and Advanced Switching: Evolutionary Path to Building Next Generation Interconnects", *Proceedings, IEEE 11th Symposium on High Performance Interconnects*, (Aug. 20-22, 2003, Piscataway, NJ), 21-29.

(Continued)

*Primary Examiner* — Christopher McCarthy
(74) *Attorney, Agent, or Firm* — Schwegman, Lundberg & Woessner, P.A.

(57) ABSTRACT

Methods, apparatus, and systems are provided to encode a low-density parity-check codeword for transmission in a communications channel. In an embodiment, the encoding may include partially computing parity-check bits in response to receiving a block of message bits before obtaining all the message bits for the low-density parity-check codeword, including updating previously partially computed parity-check bits that depend on the received block.

20 Claims, 8 Drawing Sheets

OTHER PUBLICATIONS

"Digital Video Broadcasting (DVB); Second Generation Framing Structure, Channel Coding and Modulation Systems for Broadcasting, Interactive Services, News Gathering and Other Broadband Satellite Applications", *ETSI Standards, European Telelecommunications Standards Institute, ETSI EN 302 307 V1.1.1* (Jun. 2004), 74 pg.

Richardson, T. J., et al., "Efficient encoding of low-density parity-check codes", *IEEE Transactions on Information Theory*, 47(2), (Feb. 2001),638-656.

Tellado, J., et al., "Channel Code Considerations for 10GbT Signalling", [online]. Retrieved from the Internet: <http://grouper.ieee.org/groups/802/3/10GBT/public/jan04/shalvi_1_0104.pdf>,(Jan. 2004),16 pgs.

* cited by examiner

$$300 - \begin{bmatrix} 1 & 0 & 0 & 0 & 1 & 0 & 0 & 0 & 1 & 0 & 0 & 0 & 1 & 0 & 0 & 0 \\ 0 & 1 & 0 & 0 & 0 & 1 & 0 & 0 & 0 & 1 & 0 & 0 & 0 & 1 & 0 & 0 \\ 0 & 0 & 1 & 0 & 0 & 0 & 1 & 0 & 0 & 0 & 1 & 0 & 0 & 0 & 1 & 0 \\ 0 & 0 & 0 & 1 & 0 & 0 & 0 & 1 & 0 & 0 & 0 & 1 & 0 & 0 & 0 & 1 \\ 1 & 0 & 0 & 0 & 0 & 0 & 1 & 0 & 0 & 1 & 0 & 0 & 1 & 0 & 0 & 0 \\ 0 & 1 & 0 & 0 & 1 & 0 & 0 & 0 & 0 & 0 & 1 & 0 & 0 & 1 & 0 \\ 0 & 0 & 1 & 0 & 0 & 1 & 0 & 0 & 1 & 0 & 0 & 0 & 0 & 0 & 0 & 1 \\ 0 & 0 & 0 & 1 & 0 & 0 & 1 & 0 & 0 & 1 & 0 & 0 & 1 & 0 & 0 & 0 \end{bmatrix}$$

*FIG. 3*

$$400 - \begin{bmatrix} 1 & 0 & 0 & 0 & 1 & 0 & 1 & 0 & 0 & 1 & 0 & 0 & 0 & 0 & 0 & 0 \\ 0 & 1 & 0 & 0 & 0 & 1 & 0 & 1 & 0 & 0 & 1 & 0 & 0 & 0 & 0 & 0 \\ 0 & 0 & 1 & 0 & 0 & 1 & 0 & 0 & 0 & 1 & 1 & 0 & 0 & 0 & 0 \\ 0 & 0 & 1 & 0 & 0 & 0 & 0 & 1 & 0 & 0 & 1 & 1 & 0 & 0 & 0 \\ 1 & 0 & 0 & 0 & 0 & 0 & 0 & 1 & 1 & 0 & 0 & 0 & 0 & 1 & 0 & 0 \\ 0 & 1 & 0 & 0 & 1 & 0 & 0 & 0 & 0 & 0 & 0 & 0 & 1 & 0 & 1 & 0 \\ 0 & 0 & 0 & 1 & 0 & 0 & 0 & 0 & 0 & 0 & 0 & 0 & 0 & 1 & 1 & 1 \end{bmatrix}$$

| BLOCK NUMBER | INPUT BLOCK BITS 610 | | | | BUFFER 620 | | | | | | | | | OUTPUT BLOCK BITS 630 | | | |
|---|---|---|---|---|---|---|---|---|---|---|---|---|---|---|---|---|---|
| | $d_0$ | $d_1$ | $d_2$ | $d_3$ | 0 | 1 | 2 | 3 | 4 | 5 | 6 | 7 | 8 | $o_0$ | $o_1$ | $o_2$ | $o_3$ |
| 3 | $m_0$ | $m_1$ | $m_2$ | $m_3$ | $m_0$ | $m_1$ | $m_2$ | $m_3$ | x | x | x | x | x | LAST BLOCK OF THE PREVIOUS CODEWORD | | | |
| 0 | $m_4$ | $m_5$ | $m_6$ | $m_7$ | $m_0$ | $m_1$ | $m_2$ | $m_3$ | $m_4$ | $m_5$ | $m_6$ | $m_7$ | x | $m_0$ | $m_1$ | $m_2$ | $m_3$ |
| 1 | $m_8$ | x | x | x | $m_0$ | $m_1$ | $m_2$ | $m_3$ | $m_4$ | $m_5$ | $m_6$ | $m_7$ | $m_8$ | $m_4$ | $m_5$ | $m_6$ | $m_7$ |
| 2 | x | x | x | x | $m_0$ | $m_1$ | $m_2$ | $m_3$ | $m_4$ | $m_5$ | $m_6$ | $m_7$ | $m_8$ | $m_8$ | $p_0$ | $p_1$ | $p_2$ |
| 3 | | | | | THE NEXT CODEWORD ENCODING | | | | | | | | | $p_3$ | $p_4$ | $p_5$ | $p_6$ |

| BLOCK NUMBER | INPUT BLOCK BITS | | | | PARITY CHECK BITS | | | | | | | OUTPUT BLOCK BITS | | | |
|---|---|---|---|---|---|---|---|---|---|---|---|---|---|---|---|
| | $d_0$ | $d_1$ | $d_2$ | $d_3$ | $p_0$ | $p_1$ | $p_2$ | $p_3$ | $p_4$ | $p_5$ | $p_6$ | $o_0$ | $o_1$ | $o_2$ | $o_3$ |
| 0 | $d_0$ | $d_1$ | $d_2$ | $d_3$ | $d_0$ | $d_1$ | $d_3$ | $d_2$ | $d_0$ | $d_1$ | $d_3$ | $d_0$ | $d_1$ | $d_2$ | $d_3$ |
| 1 | $m_0$ | $m_1$ | $m_2$ | $m_3$ | $p_0^{(0)} \oplus d_0 \oplus d_2$ | $p_1^{(0)} \oplus d_1 \oplus d_3$ | $p_2^{(0)} \oplus d_2$ | $p_3^{(0)}$ | $p_4^{(0)} \oplus d_3$ | $p_5^{(0)} \oplus d_0$ | $p_6^{(0)}$ | $d_0$ | $d_1$ | $d_2$ | $d_3$ |
| 2 | $m_4$ | $m_5$ | $m_6$ | $m_7$ | $p_0^{(1)}$ | $p_1^{(1)}$ | $p_2^{(1)} \oplus p_1^{(2)}$ | $p_3^{(1)} \oplus d_0 \oplus d_2^{(2)}$ | $p_4^{(1)} \oplus d_0$ | $p_5^{(1)}$ | $p_6^{(1)}$ | $d_0$ | $d_1$ | $d_2$ | $d_3$ |
| 3 | $m_8$ | x | x | x | | | $p_2^{(2)}$ | $p_3^{(2)}$ | $p_4^{(2)}$ | $p_5^{(2)} \oplus p_3^{(3)}$ | $p_6^{(2)} \oplus p_4^{(3)} \oplus p_5^{(3)}$ | $p_0$ | $p_1$ | $p_2$ | $p_3$ |
| 0 | x | x | x | x | | | | | | | | $p_3$ | $p_4$ | $p_5$ | $p_6$ |
| | | | | | | | THE NEXT CODEWORD ENCODING | | | | | | | | |

FAST LOW-DENSITY PARITY-CHECK CODE ENCODER

RELATED APPLICATION

This application is a U.S. National Stage Filing under 35U.S.C. 371from International Patent Application Serial No. PCT/RU2005/000682, filed Dec.29, 2005, and published on Jul. 5, 2007 as WO2007/075106A1, which is incorporated herein by reference in its entirety.

TECHNICAL FIELD

Embodiments of the invention relate generally to encoding for communication signals.

BACKGROUND

A communication channel, whether it is a fiber optic channel, a co-axial channel, a wired channel, a wireless channel, or a bus connecting locations in a system over which large amounts of data are transferred, can add noise and error to information being transmitted over the channel. To correct for errors added by the communication channel, information can be sent in the form of codewords, where each codeword contains the same number of total bits and in which a number of the bits are information (message) bits and a number of bits are used for error correction. A codeword having a length of n bits includes k bits for the message length of the code and r=n−k redundant bits. The r bits are for correction and may be r parity-check bits. A parity-check matrix, H, contains a set of parity-check equations that define the codeword according to the relation:

$$HC^T=0,$$

where C is the n-dimensional vector of the codeword bits. At a receiver if this relation is not satisfied, then the received codeword is not valid and must either be corrected or retransmitted.

A variety of schemes for encoding a codeword to be propagated through a communication channel exist. In high speed data communication what is needed is an encoding scheme that is accurate and fast, but at the same time can be implemented without a significant amount of complexity.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some embodiments can be combined with one or more other embodiments to form new embodiments. The following detailed description is, therefore, not to be taken in a limiting sense.

Figure 1:
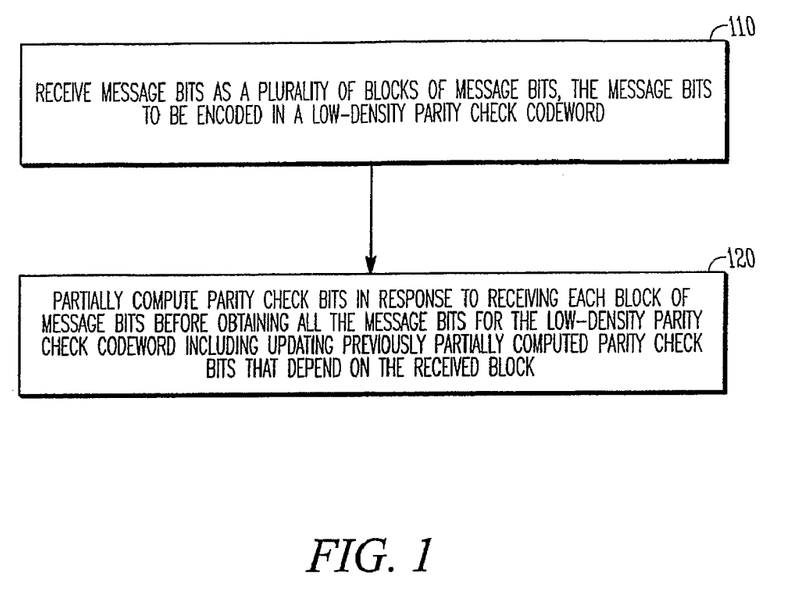
FIG. 1 shows a flow diagram of an embodiment of a method for encoding a low-density parity-check codeword.

FIG. 1 shows a flow diagram of an embodiment of a method for encoding a low-density parity-check (LDPC) codeword. At 110, message bits to be encoded are received as message blocks, where the message bits are partitioned into blocks of message bits. The message blocks may be received at different times, clocked into an encoding unit. The message bits may be encoded in a low-density parity-check codeword that includes message bits and parity-check bits. At 120, in response to receiving a block of message bits, some or all of the parity-check bits, to be generated as part of the LDPC codeword, may be partially computed before all the message bits are received. Encoding of a block of message bits may begin before all the blocks containing message bits are received in an encoding unit of an apparatus. Parity-check bits may be updated one of more times before all the message bits are received. The value of the parity-check bits for the codeword containing a specific message may be computed as a sum of one or more message bits and, for some parity-check bits, other parity-check bits. When a block of message bits is received, those parity-check bits that depend on one or more of the received message bits may be computed based on the received message bits. If the received block does not include all the message bits necessary to compute a parity-check bit, the parity-check bit is partially computed. If the received block does not include all the message bits necessary to compute parity-check bits to be used to compute another parity-check bit, the other dependent parity-check bit is partially computed. The partially computed parity-check bits are stored and updated upon reception of the next block that contains message bits on which the parity-check bit depends. If the next block of message bits does not contain a message bit for which a partially computed parity-check depends, the partially computed parity-check bit remains the same and is stored to be computed with a the reception of subsequent message blocks. In an embodiment, on reception of a first block in which the message bits are partitioned, each parity-check bit is set to value. The value may be the value of one of the message bits in the received first block. Various embodiments for encoding may be applied for forward error correction (FEC) in 10G Ethernet communication systems and other communication systems Low density parity-check FEC on the physical layer of a network has been selected for an Institute of Electrical and Electronics Engineers (IEEE) standard, IEEE 802.3an standard. In addition, an exact LDPC code was been determined and the corresponding generator and parity-check matrices have been specified. The accepted code is in systematic representation, i.e., the message bits are located in the first codeword positions followed by the parity-check bits. As a result, an encoding procedure may be directed to finding the parity-check bits associated with the message to be transmitted. Since the code is approved in the systematic form the parity-check bits can be encoded, and then all codeword symbols are known.

The approved code is a binary 2048 bits length code with 1723 message symbols. Hence, it has 325 parity-check bits. Traditionally, the generator matrix is used to encode data. In an embodiment, a parity-check matrix may be used to generate a codeword. A property of LDPC codes is that they have a small number of "ones" in their parity-check matrix, allowing reduction in encoding complexity of the code by using of a parity-check matrix for encoding instead of a generator matrix. For the given LDPC code, the number of ones in the generator matrix is 132363. Using the generator matrix encoding may require 132363 exclusive OR (XOR) gates in a traditional encoder architecture. In an embodiment using a parity-check matrix, the number of XOR gates may be reduced in an architecture taking advantage of the structure of the parity-check matrix.

Figure 2:
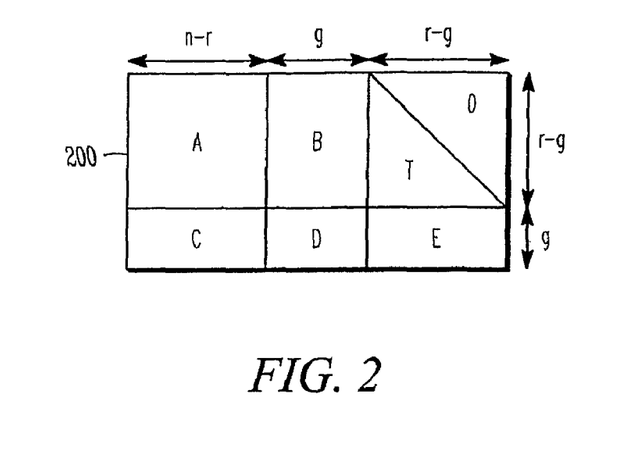
FIG. 2 shows a form into which the parity-check matrix for a low density parity-check code may be transformed in an embodiment for encoding.

The parity-check matrix, H, or for encoding LDPC codes may be transformed to a form 200 as shown in FIG. 2. Then, the matrix represents the block-structure $$H = \begin{pmatrix} A & B & T \\ C & D & E \end{pmatrix}. \quad (1)$$

By constructing the form of H as shown in equation (1) using only permutations of rows and columns in the parity-check matrix, then all blocks in equation (1) are sparse matrices.

A parity-check matrix, such as the parity-check matrix accepted for 10G Ethernet can be transformed by Gaussian elimination to an upper triangular form by changing only the order of the rows. Consider the parity-check matrix accepted for 10G Ethernet in the following discussion. After Gaussian elimination, a new parity-check matrix for the 10G Ethernet may be obtained in the form of FIG. 2. In an embodiment, the parameter g becomes equal to 1, and r−g is equal to 324. For such a parity-check matrix representation, every i-th parity-check bit depends on only message bits and parity-check bits with numbers smaller than (i−1). Then, the last 324 parity-check bits may be calculated one-by-one using the rows of the parity-check matrix if the first parity-check bit is already found.

The complexity of finding any parity-check bit except the first bit may be related to the complexity of computation of 31 XORs, because the parity-check matrix contains 32 ones per row. To find the last 324 parity-check bits, 31×324=10044 XOR gates may be used. To find the first parity-check, the following equation (2) may be calculated:

$$p_0 = (-ET^{-1}B+D)^{-1}(-ET^{-1}A+C) \times M, \quad (2)$$

where M is the message set, $(-ET^{-1}B+D)^{-1}(-E^{-1}A+C)$ is a one row matrix that contains 856 ones. Hence, 855 XOR gates may be used to compute the first parity-check bit. An architecture using a parity-check matrix for encoding may use 10899 XOR gates for encoding, which is much smaller in complexity than the complexity of the encoder based on the generator matrix.

An architecture for an encoder that encodes bit-by-bit may be impractical to use in practice when the clock rate for such encoding is too high. For example, bit-by-bit encoding of codeword for 10G Ethernet may need a clock rate of 5.7143 GHz, which may be too high. An architecture that encodes a complete codeword on one clock may also be impractical due to too high latency. To address these two situations, information may be encoded by encoding data on a block-by-block basis, for example, in blocks of 32 or 64 bits. Block encoding is not limited to 32 or 64 bits, but may be applied in blocks with a fewer number of bits or in blocks with a larger number of bits depending on the application.

Figure 3:
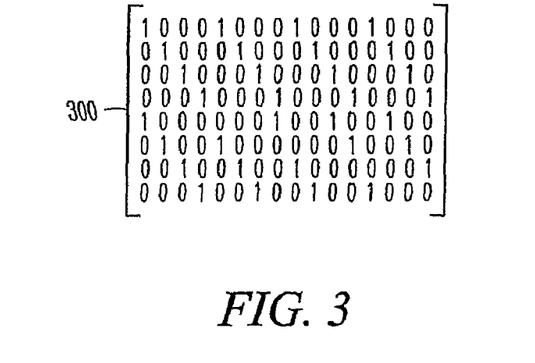
FIG. 3 shows a source parity-check matrix in an example of a (16, 9) Gilbert LDPC code.
Figure 4:
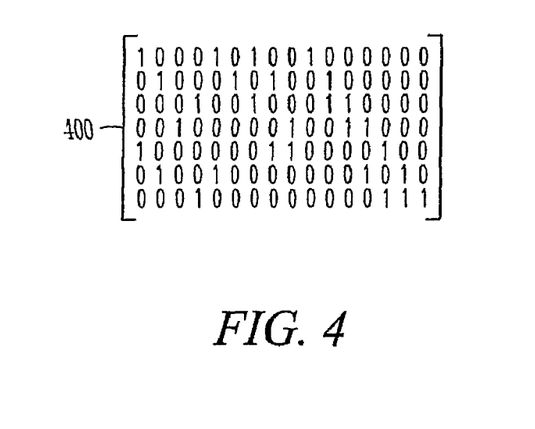
FIG. 4 shows a parity-check matrix in upper-triangular form modified from the matrix of FIG. 3 for the (16, 9) Gilbert LDPC code that can be used to encode messages.

Consider a classical implementation of an encoder based on a source parity-check matrix 300 in an example of a (16, 9) Gilbert LDPC code shown in FIG. 3. The codeword, c, for the (16, 9) Gilbert LDPC code may be constructed in systematic form as:

$$c=[m_0, m_1, m_2, m_3, m_4, m_5, m_6, m_7, m_8, p_0, p_1, p_2, p_3, p_4, p_5, p_6] \quad (3),$$

where $m_i$ is the $i^{th}$ message bit and $p_i$ is the $i^{th}$ parity-check bit. FIG. 4 shows a modified parity-check matrix 400 in upper-triangular form for the (16, 9) Gilbert LDPC code that can be used to encode messages. With the systematic form of the codeword and the source parity-check matrix 400, the set (4) of parity-check equations for the (16, 9) Gilbert LDPC code becomes $$p_0 = m_0 + m_4 + m_6$$

$$p_1 = m_1 + m_5 + m_7$$

$$p_2 = m_3 + m_6 + p_1$$

$$p_3 = m_2 + m_8 + p_2$$

$$p_4 = m_0 + m_7 + m_8$$

$$p_5 = m_1 + m_4 + p_3$$

$$p_6 = m_3 + p_4 + p_5 \quad (4)$$

A classical encoder may be constructed that works by first accumulating all message bits and then computing all parity-check bits completely when all message bits are obtained.

Figure 5:
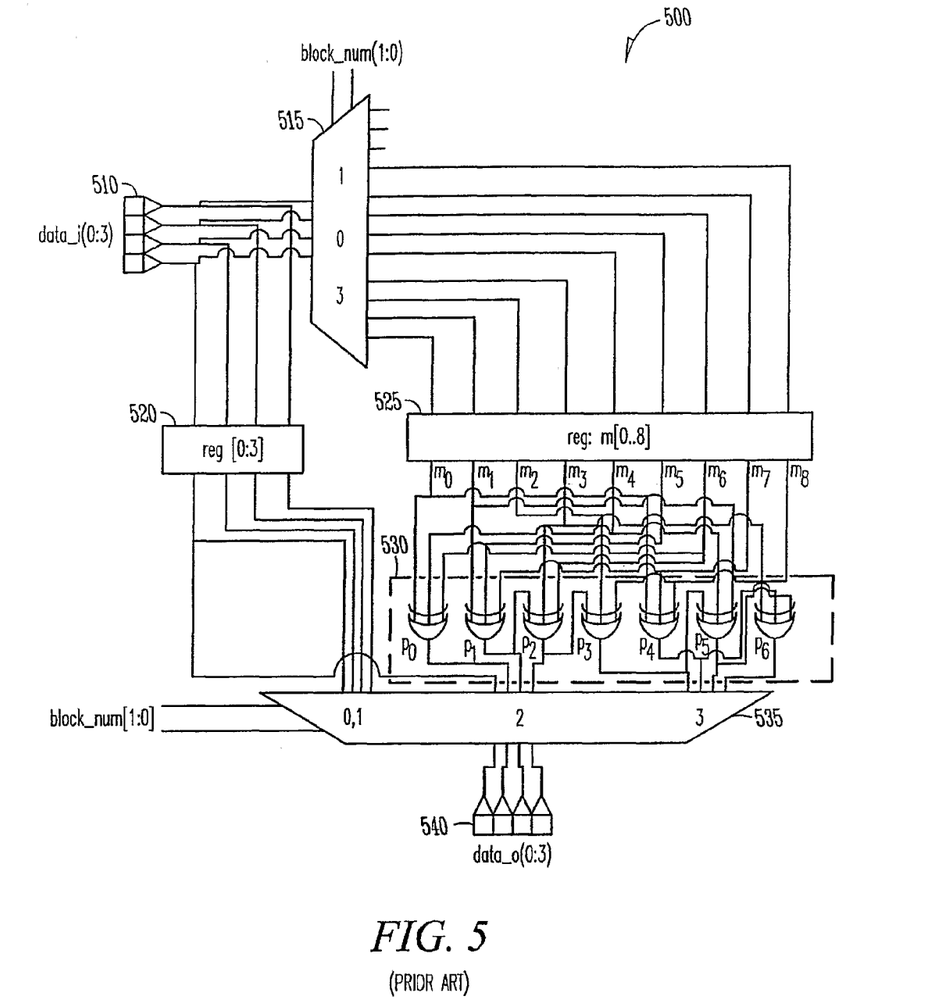
FIG. 5 schematically shows a classical encoder architecture 500 for the (16, 9) Gilbert LDPC code of FIGS. 3-4.

FIG. 5 shows a classical encoder architecture 500 for the above (16, 9) Gilbert LDPC code in which architecture 500 uses a 4 bit block size. Encoder architecture 500 includes input data block 510, input demultiplexer 515, a register 520, an accumulation register 525, a set 530 of XOR gates, an output multiplexer 535, and an output data block 540. Input data block 510 holds a block of message bits. Input data block 510 may be realized by an electronic unit in which data may be moved into and out of. The data size of input data block 510 depends on the number of bits for a block into which the total number of bits for a codeword may be partitioned. For the example of FIG. 5, a block size of 4 bits is used for the 16 bit codeword. A block of message bits may be moved into a demultiplexer 515 using control signal block_number[1:0]. Depending on the block number, demultiplexer 515 sends message bits within each message block to the appropriate location in accumulation register 525. Accumulation register 525 functions as a buffer that accumulates values of all message bits to be encoded into a codeword. Since in this scheme all message bits should be accumulated in the buffer, accumulation register 525, before parity check bits computation can start, a one clock delay may be implemented. Register 520 may be used to implement one clock delay. Set 530 of XOR gates may be used with a specific input of message bits and parity-check bits to generate the set of parity-check bits for the codeword being generated. Though the task of encoding involves the task of obtaining parity-check bit values from message bit values, some parity-check bit values may be computed through the values of other parity-check bits. However, all parity-check bit values finally depend only on values of message bits. Output from set 530 of XOR gates is provided to output multiplexer 535, which receives block_num [1:0] control signal indicating currently encoded block number to send appropriate message and parity-check bits to output data block 540. Output data block 540 holds encoded data to provide the data to an output to send the encoded low-density parity-check codeword from encoder 500. As a result of the one clock delay to accumulate all the message bits, the encoded bits appear on the encoder output with one clock delay.

Figure 6:
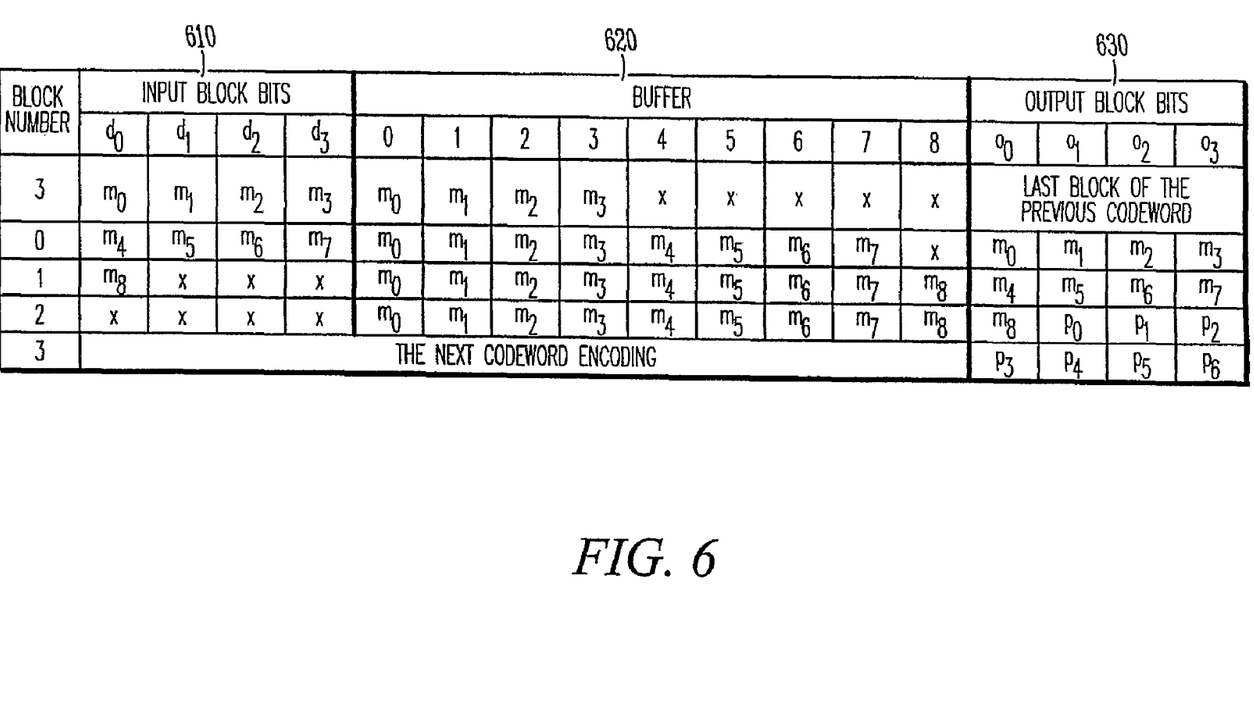
FIG. 6 shows a table demonstrating the encoding of a codeword using the encoder architecture of FIG. 5.

FIG. 6 shows a table demonstrating the encoding of one codeword using the encoder architecture of FIG. 5. The table shows the process of receiving an input message block, accumulation of message bits in a register, and sending out of encoded blocks. The table is divided into 3 parts. The first part 610 labeled "Input block bits" shows a block of input message bits that are received in blocks of length 4. Four message bits are provided in input data block 510 for each of block numbers 3, 0, 1, and 2. The second part 620 labeled "Buffer" shows the contents of accumulation register m[0 . . . 8] 525, which in this example is a register having 9 bit locations. In the "Buffer" section, message bits collected from the beginning of the current codeword encoding are presented, where the indicator x shows that the value for the bit location in input data block 510 does not matter. The third part 630 labeled "Output block bits" shows a set of bits that are sent out from encoder 500 on the current clock (at the current moment). Output block bits corresponds to output data block 540. Output bits depend on what part of the codeword is being processed at the current moment. The value of the output bits may be message bits received from demultiplexer 535, from register 520 (which in this example is a register having 4 bit locations [0-3]), the combination of message bits from register 520 and parity-check bits (which is the case when block_number=2), or the block of parity-check bits. Parity-check bits are computed according to parity-check equations (4). Output blocks as well as input blocks consist of 4 bits in encoding architecture 500.

In an embodiment, an encoding scheme based on the parity-check matrix provides an encoded codeword in which parity-check bits are partially computed. In an embodiment, computation of the parity-check bits may be started before obtaining all message symbols. In an embodiment, upon receiving a first block of message symbols, parity-check bits values that are dependent on the message symbols from the first block received may be partially computed. The partial computation may include identifying a message bit that will eventually be used to compute the parity-check and storing the value of such a message bit in a register for later use. When the second message block is received, computation of the parity-check bits that depend on the message symbols from the second message block may be performed. Such computation may include updating previously computed value of a parity-check matrix. For example, if a parity-check arises from the sum of $m_1$, $m_2$, and $m_4$, the stun $m_1+m_2$ may be computed on receiving the first block with the result stored and upon receiving the second block the result may be added to $m_4$. If the parity-check depended on $m_8$ instead of $m_4$, upon receiving the second message block, updating the parity-check would involve storing the previous result $m_1+m_2$, which may be accomplished according to various embodiments. The result may be stored in a memory location, remain in its current position, or be moved to another register depending on the architecture for encoding using partial parity-check computation. Subsequently, the parity-check bit depending on $m_8$ instead of $m_4$ will updated on receiving the third block. The partial computation continues until all blocks are received, providing the completion of the parity-check computation for the generation of the codeword containing all the desired message bits.

Figure 7:
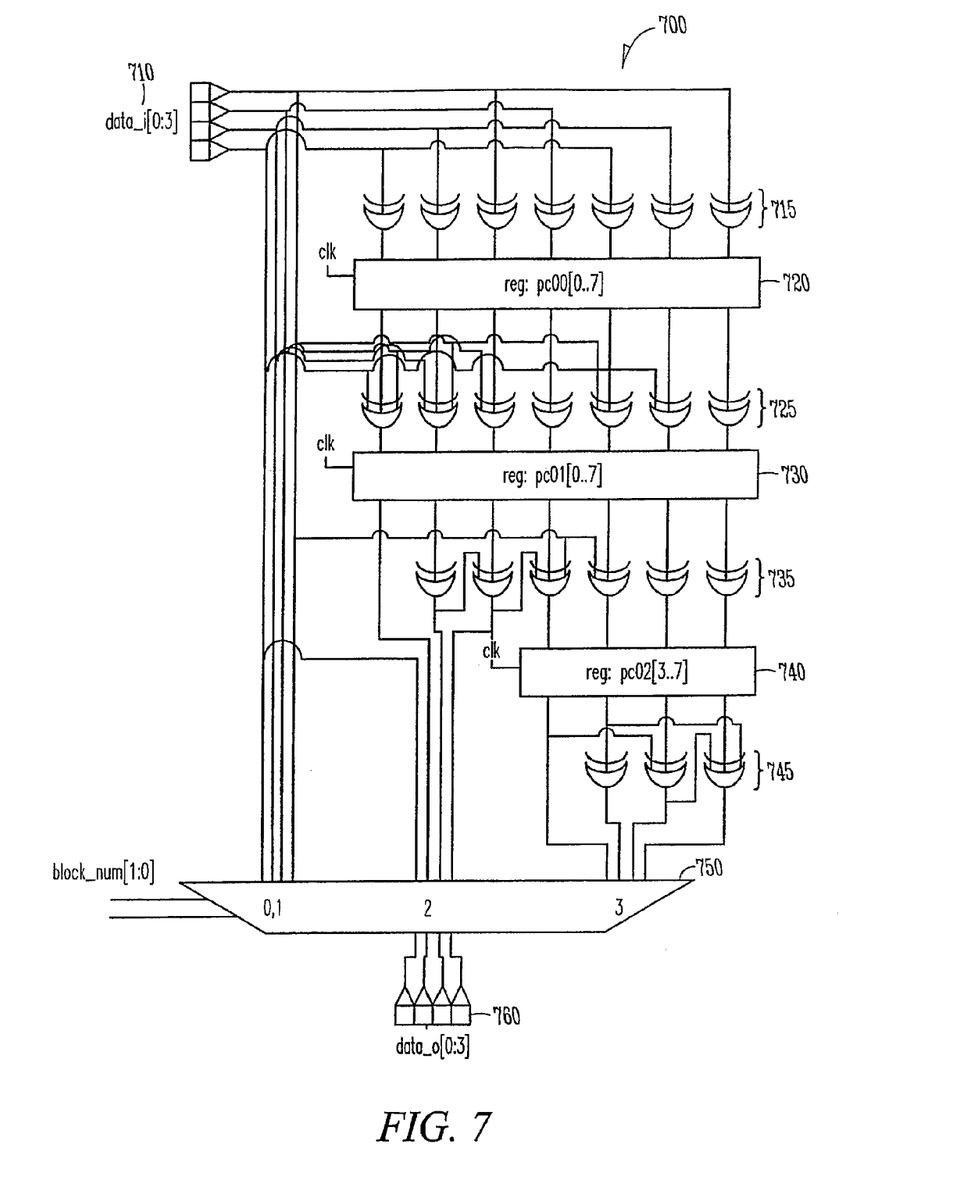
FIG. 7 shows schematically an embodiment of an encoder architecture for encoding based on a parity-check matrix in which parity-check bits are partially computed that may be applied to a (16, 9) Gilbert LDPC code.

FIG. 7 shows an embodiment of an encoder architecture 700 for encoding based on a parity-check matrix in which parity-check bits are partially computed that may be applied to a (16, 9) Gilbert LDPC code. The parity-check matrix provides the parity-check equations (4) implemented in the embodiment of encoder architecture 700. Encoder architecture 700 may include input data block 710, registers 720, 730, and 740, a multiplexer 750, and an output data block 760. Input data block 710 holds a block of message bits. Input data block 710 may be realized by an electronic unit in which data may be moved into and out of. The data size of input data block 710 depends on the number of bits for a block into which the total number of bits for a codeword may be partitioned. For the example of FIG. 7, a block size of 4 bits is used for the 16 bit codeword.

A block of message bits may be moved into multiplexer 740 using control signal block_number[1:0]. The block of message bits also may be input into a set 715 of XOR gates to partially compute parity-check bits for the encoded codeword that will contain the message bits. The output of set 715 of XOR gates may be coupled to register 720. Register 720 may hold values of all parity-check bits computed partially that depend on the message bits in the first block of bits. For the encoding of the (16, 9) LDPC code, the message bits in the first block may be message bits $m_0$, $m_1$, $m_2$, and $m_3$. Register 720 may implement a one clock delay. In an embodiment in which message bits are placed in register 720 without computation, each gate of set 715 of XOR gates may have only one input. When the parity-check equations are such that each gate of set 715 of XOR gates have only one input, then each gate may be replaced by a direct connection from input data block 710 to register 720.

The values of the parity-check bits held in register 720 may be clocked out to a set 725 of XOR gates, which may also include inputs to receive message bits from input data block 710. Set 725 of XOR gates may include different configurations of XOR gates, where the different configurations include different number of inputs for different gates. Set 725 of XOR gates may include XOR gates having three input gates, XOR gates having two input gates, and XOR gates having one input gate. Set 725 of XOR gates may partially compute parity-check bits that depend on the second block of message bits clocked in encoder 700 and the result of the previous partial computation. The number of inputs to a specific gate in set 725 of XOR gates depends on the use of the specific gate in the partial computation of the parity-check bits upon receiving the second message block. Output from each of the gates in set 725 of XOR gates may be coupled to register 730.

Register 730 may hold values of all parity-check bits computed partially that depend on the message bits in the first and second block of bits. For the encoding of the (16, 9) LDPC code, the message bits in the first and second block may be message bits $m_0$, $m_1$, $m_2$, $m_3$, $m_5$, $m_6$, and $m_7$. Values of parity-check bits held in register 730 may be clocked out to a set 735 of XOR gates, which may also include inputs to receive message bits from input data block 710. A value of the parity-check bits held in register 730 may be clocked out to multiplexer 750.

Set 735 of XOR gates may partially compute parity-check bits that depend on the third block of message bits clocked in encoder 700 and the result of the previous partial computation. The number of inputs to a specific gate in set 735 of XOR gates depends on the use of the specific gate in the partial computation of the parity-check bits upon receiving the third message block. Output from some of the gates in set 735 of XOR gates may be coupled to register 740. Output from some of the gates in the set 735 of XOR gates may be coupled to multiplexer 750.

Register 740 may hold values of all parity-check bits computed partially that depend on the message bits in the first, second, and third block of bits and parity-check bits $p_0$, $p_1$, and $p_2$. For the encoding of the (16, 9) LDPC code, the message bits in the first three blocks may be message bits, $m_0$, $m_1$, $m_2$, $m_3$, $m_4$, $m_5$, $m_6$, $m_7$, and $m_8$. Some of the values held in register 740 may be clocked out to a set 745 of XOR gates to complete the computation of the parity-check bits for the codeword.

The output of set 745 of XOR gates may be coupled to multiplexer 750. Depending on the parity-check equations being implemented, multiplexer 750 may receive outputs directly from the input data block, various sets of XOR gates, and registers that hold the result of partial computations. Multiplexer 750 may be coupled to output data block 760 to provide message bits and parity-check bits arranged in output blocks, which in the embodiment shown in FIG. 7 is in output blocks 0 . . . 3. In FIG. 7, multiplexer 750 receives message bits from input data block 710 to provide message bits in output blocks 0 and 1. Multiplexer 750 receives a message bit from input data block 710 and party-check bits from register 730 and set 735 of XOR gates to provide a message bit and parity-check bits in output block 2. Multiplexer 750 receives party-check bits from register 740 and set 745 of XOR gates to provide parity-check bits in output block 3. Output data block 760 provides the blocks of message bits and parity-check bits to an output from encoder 760 to provide the encoded codeword for transmission.

In an embodiment, registers 720, 730, and 740, arranged to hold partially computed parity-check bits, may be sized to the number of bits locations needed to continue computing parity-check bits that have not been completely determined. In the embodiment illustrated in FIG. 7 for a (16, 9) Gilbert LDPC code, registers 720 and 730 include bit locations equal to the total number of parity-check bits for the (16, 9) LDPC code, which is 7 bits. Register 740 may be realized with 5 bit locations for the partially computed parity-check bits $p_3$, $p_4$, $p_5$, $p_6$, and $p_7$, since determination of parity-checks $p_0$, $p_1$, and $p_2$ is completed with the action of set 735 of XOR gates and these parity-check bits are not specifically used in the final determination of parity-check bits $p_3$, $p_4$, $p_5$, $p_6$, and $p_7$. The arrangement of registers, sets of XOR gates, number of inputs to a specific XOR gate, and the size of the registers may vary with the codeword construction being encoded. Any code having a parity-check matrix in an upper-triangular form may be encoded using an embodiment of an encoder having an architecture in which parity-check bits may be partially computed before all the message bits are collected in the encoding process.

Figure 8:
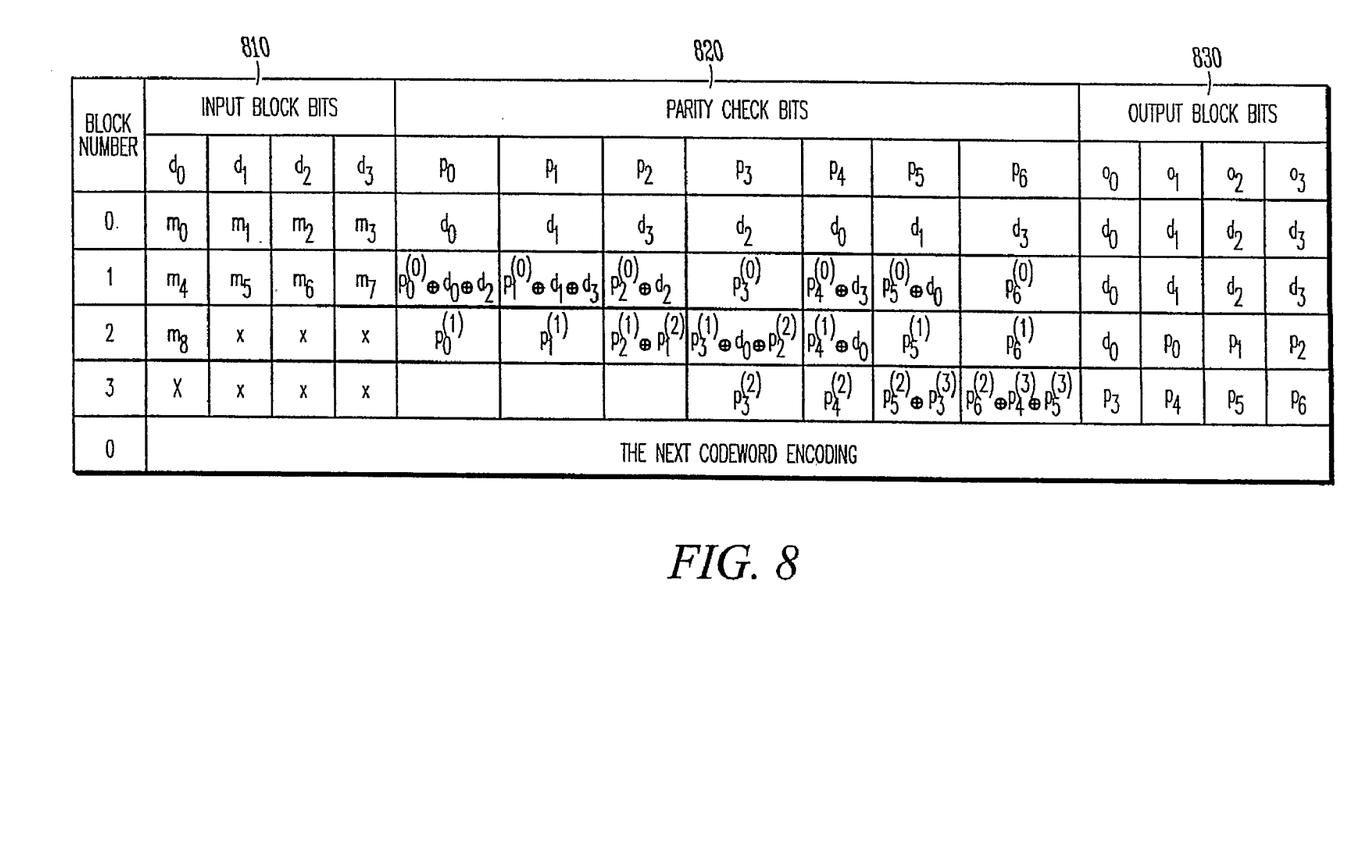
FIG. 8 shows a table demonstrating the encoding of a codeword using the embodiment of an encoder architecture illustrated in FIG. 7.

FIG. 8 shows a table demonstrating the encoding of a codeword using the embodiment of an encoder architecture 700 illustrated in FIG. 7. Encoder architecture 700 computes parity-check bits partially. When a next block of message bits are received, all parity-check bit values (partially computed) are read out from a register, those parity-check bits that depend on the received message bits are updated, and all parity-check bit values may be stored in a next register. In an embodiment, a series of registers are arranged for sequential use in an encoding process. In an embodiment, on the input of the first of the set of message blocks containing message bits, the first register in a sequential arrangement (register 720 in FIG. 7) is provided an initial value for each parity-check bit to be encoded into a codeword for transmission of all the message bits.

The table of FIG. 8 is divided into 3 parts. The first part 810 includes input block bits, which are a current block of message bits. The i-th bit in current block is denoted as $d_i$, where for block number 0, $d_0=m_0$, $d_1=m_1$, $d_2=m_3$, $d_0=m_4$, for block number 1, $d_0=m_4$, $d_1=m_5$, $d_2=m_6$, $d_0=m_7$, and so on for block numbers 2 and 3, where x indicates that the value at this location for a given block does not matter. The second section 820 of the table labeled parity-check bits shows the values of all parity check bits. In a cell in section 820, the process of updating of the parity-check bit values depending on values of message bits of current block is shown. In section 820, $d_i$ denotes the i-th message bit value in current message block, $p^{(j)}_i$ denotes the value of i-th parity-check bit that was obtained on the j-th step. The operator (+) denotes XOR operation. The third section 830 of the table labeled output block bits shows the bits sent out from encoder 700 on the current clock.

Figure 9:
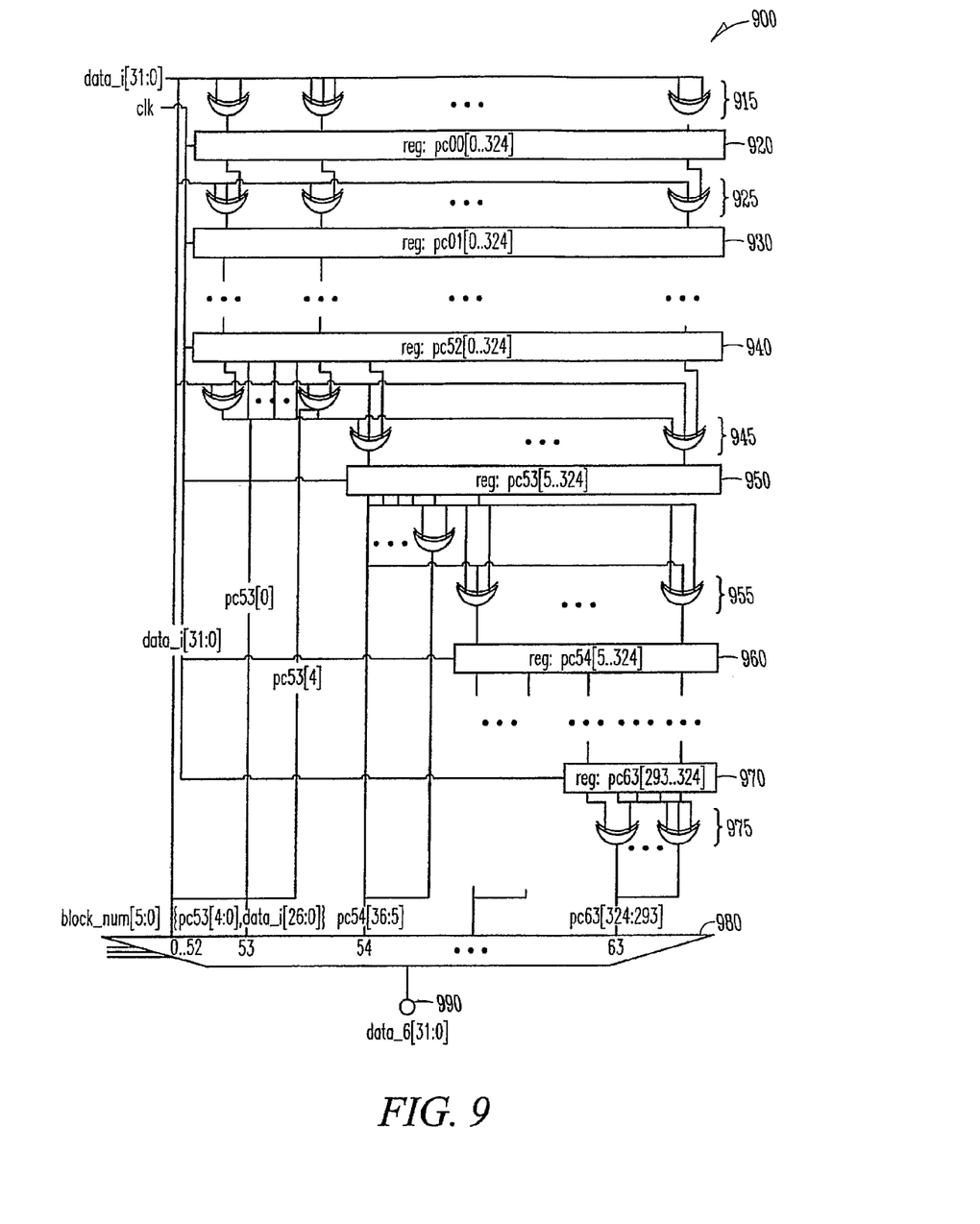
FIG. 9 schematically illustrates an embodiment of an encoder to encode information in a specified code format.

Various embodiments for encoder architectures and codeword encoding may be used to encode any code having a parity-check matrix in an upper-triangular form. An embodiment for an encoder is applicable for the LDPC code approved by the IEEE 802.3an Task Force. FIG. 9 schematically illustrates an embodiment of an encoder architecture 900 to encode information in the approved code format. Encoder 900 includes a number of registers to hold values of parity-check bits partially computed in a process to generate the complete set of parity-check bits for the information structure containing the complete set of message bits. Encoder 900 also includes a number of sets of XOR gates to partially compute values of the parity-check bits and provide these values to the registers. The LDPC code, approved by the IEEE 802.3an Task Force, has a 2048 bits length with 1723 message symbols and 325 parity-check bits. The 2048 bits length may be partitioned into blocks. In the embodiment illustrated in FIG. 9, a partition includes a block of 32 bits. Another block size includes 64 bits. Embodiments for an encoder are not limited to an architecture that operates on 32-bit blocks and/or 64-bit blocks. For a block size of 32, there are 64 blocks such that block size*number of blocks=codeword length. Each data block may be encoded using this scheme of FIG. 9. With a codeword divided into 64 blocks, 64 registers may be used. Each register width (number of locations) may be selected to be equal to the number of parity-check bits, 325 in the case of a (2048, 1723) LDPC code, to store the values of all parity-check bits on each clock, which may be considered as being arranged as 64*325=20800 1-bit registers. However, all parity-check bits may not be needed to be stored on the last stages. Then, not storing the parity-check bits completely computed, the number may reduce to 12248 1-bit registers. For discussion purposes, only registers 920, 930, 940, 950, 960, and 970 and sets of XOR gates 915, 925, 945, 955, and 975 are shown.

In an embodiment, an encoding architecture for a (2048, 1723) LDPC code may use registers that have a maximum length of 325 bit locations to store all parity-check bits. As the encoding process proceeds, parity-check bits that are completely determined and are not used to determine other parity-check bits need not be stored in a register and may be sent to multiplexer 980. As a result, some of the registers may have a 325 bit length, while other registers have a smaller length. Registers 920 (pc00), ..., 940 (pc52) contain 325 (0 ... 324) locations. Register 950 (reg53) contains only 325−5=320 location (5 ... 324), because at this location in the encoding architecture parity-check bits labeled with numbers 5 ... 324 only are stored with the first five parity-check bits 0 ... 4 sent to multiplexer 980. Register 960 (pc54) contains only 325−5−32=288 locations because parity-check bits labeled 0 ... 4 have already been sent to multiplexer 980 for output on the previous clock and parity-check bits 5 ... 36 are sent to multiplexer 980 on the current clock. The size of the registers may progressively decrease. In FIG. 9, {pc53[4:0], data_$_i$ [26:0]} indicates that 5 parity-check bits are taken from register 950 (pc53) identified with numbers 4 ... 0 and 27 message bits from bus named data i[26:0] indicating message bits labeled 0 ... 26. The term pc54[36:5] indicates a set of parity-check bits from register 960 (pc54) labeled with numbers 5 ... 36, and pc63[324:293] indicates a set of parity-check bits from register 970 (pc63) labeled with numbers 293 ... 324. In such an architecture as illustrated in FIG. 9, it is shown that bits may be grouped into 32 bit blocks. These blocks may be sent to multiplexer 980, where multiplexer 980 selects one of the blocks, depending on the block number which is currently being processed, to be provided to encoder output 990. On each clock, one output block of 32 bits may be forwarded out with only one block of input message bits of 32 bits forwarded into encoder 900.

Table 1 shows characteristics of encoder embodiments with respect to classical architecture implemented using field programmable gate array (FPGA) technology. All logic functions (sets of XOR) may be implemented in a chip as a set of Arithmetic-Logic Unit Tables (ALUT). Any logic functions of two, three or four 1-bit arguments with one 1-bit output may be implemented as one ALUT. If there are more than four arguments or more than one output, more then one ALUT may be used.

TABLE 1

| Architecture | Block size, bits | Minimum clock rate required to obtain throughput required for 10G Ethernet | Estimated clock rate, MHz | Size, ALUTs/REGs |
|---|---|---|---|---|
| Classical | 32 | 178.6 | 83.0 | 4674/2231 |
| Classical | 64 | 89.3 | 89.4 | 4645/2363 |
| Partial Computation | 32 | 178.6 | 272.3 | 11748/12248 |
| Partial Computation | 64 | 89.3 | 221.6 | 8420/8639 |

Table 2 shows characteristics of encoder embodiments with respect to classical architecture implemented on an application-specific integrated circuit (ASIC).

TABLE 2

| Architecture | Block size, bits | Minimum clock rate required to obtain throughput required for 10G Ethernet | Estimated clock rate on, MHz | Size, um$^2$ |
|---|---|---|---|---|
| Classical | 32 | 178.6 | 104.4 | 0.497 |
| Partial Computation | 32 | 178.6 | 388.1 | 1.299 |

The clock rate as demonstrated in Tables 1 and 2 for an embodiment of an encoder architecture may be two to three times higher than a classical encoder architecture. In an embodiment, a smaller block size may lead to a higher difference between a classical encoder scheme and an embodiment of an encoder scheme that utilizes partial parity-check computation as discussed herein. The classic (traditional) approach using a 32 bit block size may generate an operational rate of about 3.3 Gbit per second, which may not be appropriate for operation at a clock rate required for 10G Ethernet. Embodiments for an encoder having an architecture providing partial computations of parity-check bits using a 32 bit input block may operate at 388 MHz clock rate to generate 12 Gbits per second. Various embodiments may be structured on a FPGA to obtain throughput of 10Gb/s. Embodiments for such an encoder architecture may be in 10G Ethernet network cards and other communication oriented projects that use block codes for error correction.

In various embodiments, an encoder may have an architecture to partially compute parity-check bits before accumulating all the message bits for a process to generate the parity-check bits of the codeword containing all the message bits. The architecture may include XOR gates to perform the partial determination of the parity-check bits. Arrangement of XOR gates may depend on the parity-check equations for the codeword to be generated. An XOR may have a number of inputs which may include inputs from a block containing message bits and values of previously partially computed parity-check bits. Some inputs to XOR gates may include values of parity-check bits which have been completely determined. In an embodiment, an encoder architecture includes generation of one or more parity-check bits completely determined prior to the input of all the message bits to be encoded. In an embodiment, in place of or in conjunction with XOR gates, partial computation of parity-check bits may be performed using logic units, combination of logic units, or instructions stored in a machine-readable medium, which when performed by a machine cause the machine to partially compute parity-check bits before accumulating all the message bits to be encoded.

The results of partial computation of parity-check bits may be held in a register, memory, or other units that allow bits to be read in and read out during an encoding process. A register width may depend on the number of parity-check bits, while the number of registers depends on the codeword length (number of columns in the parity-check matrix) and input block size, where block size * number of blocks=codeword length, and the input block size may be selected based on the application. A set of registers may include registers sequentially arranged with XOR gates or other computational units coupling one register to another to facilitate the encoding. Data may be transferred in and/or out of registers using a system clock or a clock adapted for the encoding process. In an embodiment, the set of registers may have a maximum length equal to the number of parity-check bits to be used in the codeword being generated. The set of registers may include registers having smaller lengths than the number of parity-check bits to be used in the codeword being generated, such that the length corresponds to the number of parity-check bits remaining to be determined in the encoding architecture. In an embodiment, memory may be used to store the parity-check bits both as partially computed values and as completely computed values.

Various embodiments or combination of embodiments for apparatus and methods for encoding a low-density parity-check codeword with message bits and parity-check bits such that the parity-check bits may be determined in a process and/or architecture that partially computes parity-check bits may be realized in hardware implementations, software implementations, and combinations of hardware and software implementations. The partial computation of parity-check bits may begin in response to receiving a block of message bits before obtaining all the message bits for the low-density parity-check codeword. The computation of parity-check bits may include updating previously partially computed parity-check bits that depend on the received block. These implementations may include a computer-readable medium having computer-executable instructions for performing various embodiments similar to embodiments discussed herein. The computer-readable medium is not limited to any one type of medium. The computer-readable medium used will depend on the application using an embodiment.

Figure 10:
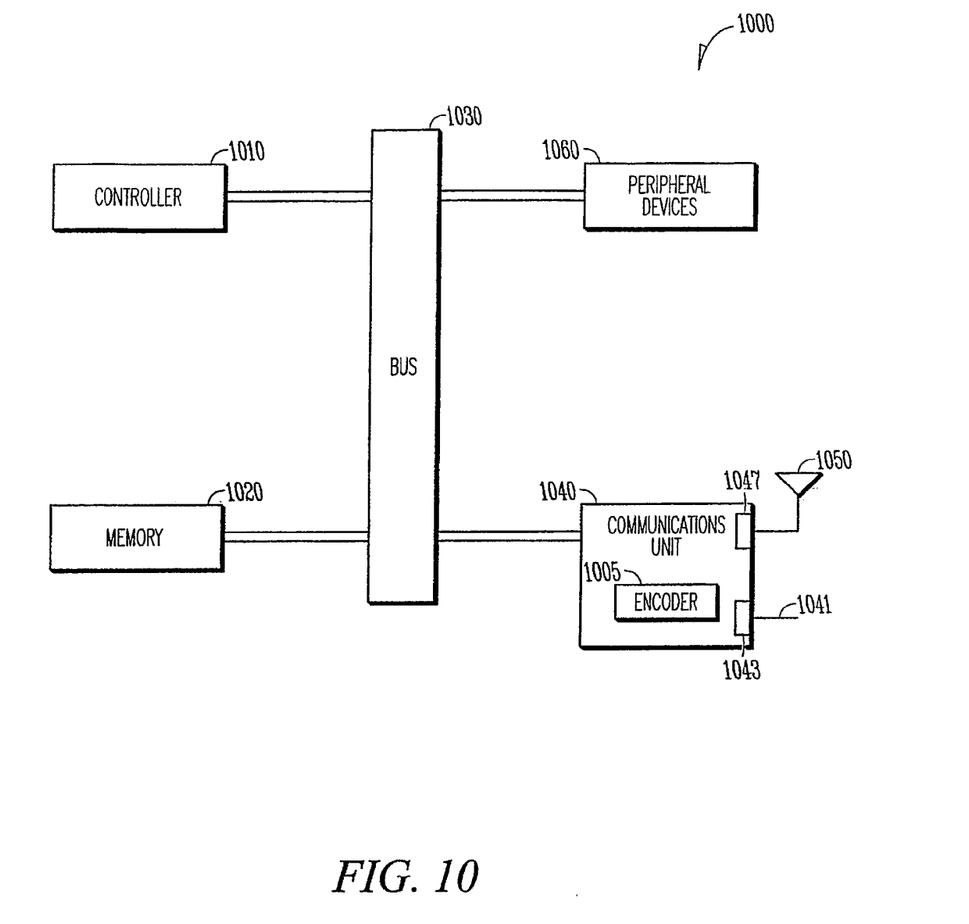
FIG. 10 illustrates a block diagram of an embodiment of a system having a an encoder architecture to partially compute parity-check bits before accumulating all the message bits for a process to generate the parity-check bits of the codeword containing all the message bits.

FIG. 10 illustrates a block diagram of an embodiment of a system 1000 having an encoder 1005 having an architecture to partially compute parity-check bits before accumulating all the message bits for a process to generate the parity-check bits of the codeword containing all the message bits. Encoder 1005 may be realized with a hardware architecture, a software based architecture, or combination of hardware/software architecture. System 1000 may also include a controller 1010 and a bus 1030, where bus 1030 provides a communication path between controller 1010 and a communication unit 1040. In an embodiment, controller 1010 is a processor. Bus 1030 may be a parallel bus. Bus 1030 may be a serial bus. Bus 1030 may be compatible with Peripheral Component Interconnect (PCI) or with PCI express. An embodiment, system 1000 may include a memory 1020 and an additional peripheral device or devices 1060 coupled to bus 1030. Peripheral devices 1060 may include displays, memory, or other control devices that may operate in conjunction with controller 1010, communication unit 1040, and/or encoder 1005.

Various embodiments for system 1000 may be realized. System 1000 may be arranged as a node, or a component of a node, in a network. The network may have a number of nodes, where each node may represent processing systems having a physical layer (PHY) entity arranged to operate in accordance with 10GBase-T as defined by the IEEE 802.3an series of standards, for example. The 10GBase-T PHY may interface with, for example, a 10G media access control (MAC) and Gigabit Media Independent Interface (XGMII) in an IEEE architecture. The 10GBase-T PHY may include part of a network interface card (NIC), for example. A network node may be realized as one or more systems. A network node may include any processing system and/or communications device suitable for use with a 10GBase-T device. For example, network nodes may be implemented as a pair of switches, a pair of routers, a pair of servers, a switch and a router, a switch and a server, a server and a router, and so forth. In addition, network nodes also may be part of a modular system in which 10GBase-T is the high-speed connection for the system. Network nodes may include high-end servers, supercomputers, clusters, grid computing, workgroup switch uplinks, aggregation uplinks, storage systems, and so forth. The embodiments are not limited in this context.

Communication unit 1040 may include encoder 1005. Encoder 1005 may be a separate module in system 1000 operatively coupled to communication unit 1040 to provide messages encoded to be transmitted in communication signals. In an embodiment, communication unit 1040 may include a network interface card. In an embodiment, communication unit 1040 may include a communications device suitable for use with a 10GBase-T device. In a wireless embodiment, communication unit 1040 may include a connection 1047 to couple to an antenna 1050. Connection 1047 may provide an output to send an encoded low-density parity-check codeword out from encoder 1005. In an embodiment, antenna 1050 may be a substantially omnidirectional antenna. Communication unit 1040 may include a connection 1043 to couple to a transmission medium 1041. Connection 1043 may provide an output to send an encoded low-density parity-check codeword out from encoder 1005. Transmission medium 1041 may be an optical fiber medium. Transmission medium 1041 may couple to a wired network. Transmission medium 1041 may be cable. Transmission medium 1041 may include a coaxial cable, an unshielded twisted pair cable, or a shielded twisted pair cable.

System 1000 may include, but is not limited to, information handling devices, wireless systems, telecommunication systems, fiber optic systems, electro-optic systems, and computers. Embodiments for an encoding scheme similar to those described herein may be adapted to be used in any system operating with a communication channel. Such embodiments may be used with an Ethernet channel, including a wireless Ethernet channel. The communication channel may be part of a land based communication network or a wireless communication network. Indeed, embodiments of the present invention may well be implemented as part of any wireless system using multi-carrier wireless communication channels (e.g., orthogonal frequency-division multiplexing (OFDM), discrete multi-tone modulation (DMT), etc.), such as may be used within, without limitation, a wireless personal area network (WPAN), a wireless local area network (WLAN), a wireless metropolitan are network (WMAN), a wireless wide area network (WWAN), a cellular network, a third generation (3G) network, a fourth generation (4G) network, a universal mobile telephone system (UMTS), and similar communication systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. A method comprising:
   encoding a low-density parity-check codeword with message bits and parity-check bits, the encoding including:
   receiving the message bits as a plurality of blocks of message bits;
   partially computing parity-check bits in response to receiving a block of message bits of the plurality of blocks before obtaining all the message bits for the low-density parity-check codeword, including updating previously partially computed parity-check bits that depend on the received block; and
   encoding using a clock rate greater than 200 MHz.

2. A method of claim 1, wherein the method includes completing output of data blocks for the encoded the low-density parity-check codeword before encoding another codeword.

3. The method of claim 1, wherein the method includes encoding a low-density parity-check codeword using a parity-check for 10G Ethernet, the parity-check matrix having an upper-triangle form.

4. The method of claim 1, wherein the method includes encoding a low-density parity-check codeword having a length of 2048 binary bits with 1723 message symbols and 325 parity-check bits.

5. The method of claim 1, wherein the updating previously partially computed parity-check bits includes reading out the previously partially computed parity-check bits from a register, modifying the previously partially computed parity-check bits using message bits in the received block, and storing all parity-check bits as computed in another register.

6. A method comprising:
encoding a low-density parity-check codeword with message bits and parity-check bits, the encoding including:
receiving the message bits as a plurality of blocks of message bits; and
partially computing parity-check bits in response to receiving a block of message bits before obtaining all the message bits for the low-density parity-check codeword, including updating previously partially computed parity-check bits that depend on the received block, wherein updating previously partially computed parity-check bits includes reading out the previously partially computed parity-check bits from a register, modifying the previously partially computed parity-check bits using message bits in the received block, and storing all parity-check bits as computed in another register.

7. An apparatus comprising:
an encoder to encode a low-density parity-check codeword with message bits and parity-check bits, the encoder including:
an input data block to receive a block of message bits;
a plurality of registers to hold partially computed parity-check bits;
logic units coupled between the registers, the logic units to update the partially computed parity-check bits; and
an output block to hold an output encoded data block, wherein the encoder has a clock rate greater than 200 MHz or the input data block has a block size of 32 bits or the input data block has a block size of 64 bits; and
an output to send the encoded low-density parity-check codeword from the encoder.

8. The apparatus of claim 7, wherein the logic units include XOR gates.

9. The apparatus of claim 7, wherein the encoder has a clock rate greater than 200 MHz.

10. The apparatus of claim 7, wherein the input data block has a block size of 32 bits.

11. The apparatus of claim 7, wherein the input data block has a block size of 64 bits.

12. The apparatus of claim 7, wherein each register of the plurality of registers is sized to hold only parity-check bits that are not completely computed and not used in further computations.

13. The apparatus of claim 7, wherein the low-density parity-check codeword includes a length of 2048 binary bits with 1723 message symbols and 325 parity-check bits.

14. A system comprising:
a controller;
a parallel bus; and
an encoder communicatively coupled to the controller through the parallel bus, the encoder to encode a low-density parity-check codeword with message bits and parity-check bits, the encoder including:
an input data block to receive a block of message bits, wherein the input data block has a block size greater than or equal to 32 bits;
a plurality of registers to hold partially computed parity-check bits;
logic units coupled between the registers, the logic units to update the partially computed parity-check bits; and
an output block to provide an output encoded data block; and
an output to send the encoded low-density parity-check codeword from the encoder.

15. The system of claim 14, wherein the encoder has a clock rate greater than 200 MHz.

16. The system of claim 14, wherein the input data block has a block size equal to 32 bits.

17. The system of claim 14, wherein each register of the plurality of registers is sized to hold only parity-check bits that are not completely computed and not used in further computations.

18. The system of claim 14, wherein the low-density parity-check codeword includes a length of 2048 binary bits with 1723 message symbols and 325 parity-check bits.

19. The system of claim 14, wherein the system includes an Ethernet network card in which the encoder is disposed.

20. The system of claim 14, wherein the system includes a network interface compatible with PCI express.

* * * * *

UNITED STATES PATENT AND TRADEMARK OFFICE
CERTIFICATE OF CORRECTION

PATENT NO. : 8,271,850 B2  Page 1 of 1
APPLICATION NO. : 12/087177
DATED : September 18, 2012
INVENTOR(S) : Efimov et al.

It is certified that error appears in the above-identified patent and that said Letters Patent is hereby corrected as shown below:

In the Claims

In column 12, line 60, in Claim 2, delete "A" and insert --The--, therefor

In column 12, line 66, in Claim 3, after "check", insert --matrix--, therefor

In column 12, line 67, in Claim 3, delete "triangle" and insert --triangular--, therefor In column 13, line 17, in Claim 6, delete "a" and insert --each--, therefor Signed and Sealed this
Second Day of December, 2014

Michelle K. Lee
*Deputy Director of the United States Patent and Trademark Office*